(12) United States Patent
Nojima

(10) Patent No.: US 6,292,391 B1
(45) Date of Patent: Sep. 18, 2001

(54) ISOLATION CIRCUIT AND METHOD FOR CONTROLLING DISCHARGE OF HIGH-VOLTAGE IN A FLASH EEPROM

(75) Inventor: Isao Nojima, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/536,387

(22) Filed: Mar. 28, 2000

(51) Int. Cl.[7] .................................................. G11C 16/04
(52) U.S. Cl. .......................................................... 365/185.05
(58) Field of Search ........................ 365/189.05, 189.09, 365/189.11, 226, 185.25, 185.27, 185.33

(56) References Cited

U.S. PATENT DOCUMENTS

| | | | |
|---|---|---|---|
| 4,862,415 | 8/1989 | Nakano | 365/189.09 |
| 5,099,143 | 3/1992 | Arakawa | 365/189.09 |
| 5,200,921 | 4/1993 | Okajima | 365/189.11 |
| 5,265,052 | 11/1993 | D'Arrigo et al. | 365/189.09 |
| 5,309,012 | 5/1994 | Jex et al. | 257/314 |
| 5,636,175 * | 6/1997 | McLaury | 365/189.11 |
| 5,657,278 | 8/1997 | Lee | 365/189.09 |
| 5,774,406 | 6/1998 | Kowshik | 365/189.09 |
| 5,808,940 | 9/1998 | Ohta et al. | 365/185.18 |
| 5,812,463 * | 9/1998 | Park | 365/189.05 |

* cited by examiner

Primary Examiner—Trong Phan
(74) Attorney, Agent, or Firm—Gray Cary Ware & Freidenrich LLP

(57) ABSTRACT

A high-voltage isolating circuit for controlling the discharge of high-voltage a memory array is provided comprising a line connected to individual memory cells of the memory array, the line having both a high-voltage portion and a low-voltage portion, such that the line is capable of providing a high-voltage and a low-voltage to the memory cells; and an isolation transistor having a first source/drain terminal coupled with the high-voltage portion of the line and an opposing source/drain terminal coupled with the low-voltage portion of the line. Further, the substrate of the transistor is coupled with the high-voltage portion of the line, such that the voltage potential of the line can be maintained within a certain voltage range when the low-voltage portion of the line is at a first voltage potential, and wherein the high-voltage portion of the line can be discharged when the low-voltage portion of the line is at a second voltage potential. As a result, latch-up of the circuit can be prevented.

16 Claims, 5 Drawing Sheets

ISOLATION CIRCUIT AND METHOD FOR CONTROLLING DISCHARGE OF HIGH-VOLTAGE IN A FLASH EEPROM

BACKGROUND OF THE INVENTION

1. Field of the Invention

The present invention relates to circuitry for applying reading, programming and erasing voltages to wordlines of EEPROM arrays (including flash EEPROM arrays) and to the control gates of the individual memory cells attached to those word lines while reducing the latch-up phenomenon that can occur during high/low voltage switching operations. More specifically, the present invention relates to isolation circuitry for controlling the discharge of high-voltage in an EEPROM.

2. Description of the Related Art

EEPROM arrays typically require circuitry that will switch as many as four different values of voltage to each wordline for the purposes of reading, programming and erasing information stored on the floating gates.

For example, as shown in FIG. 1, during a read operation of EEPROM cells of the floating gate type, shown and described in U.S. Pat. No. 5,572,054, whose disclosure is incorporated herein by reference, the common source line 14 of the array 500 is brought to a ground potential. The selected column address line 18a, supplied to the selected memory cell 100, is brought to +2 volts. The selected row address line 62a, connected to the selected memory cell 100, is brought to +5 volts. The selected memory cell 100 can then be read out.

During programming of such EEPROMs, the column address line 18a is brought to ground potential or a low potential between, for example, ground and +1 volt. The particular row address line 62a, which is connected to the gate 28 of the particular memory cell 100 to be programmed is brought to +1 volt or higher depending upon the voltage of the column address line 18a. The unselected row address lines 62(b . . . z) are brought to a ground potential. The common source line 14 of the memory array 500 is brought to a high positive potential, such as +12 volts. The unselected column lines 18(b . . . z) are brought to a high potential, such as +5 volts. This causes programming of the selected memory cell 100.

Finally, during erasing operations of these EEPROMS, the plurality of column address lines 18(a . . . z) are all brought to a ground potential. The plurality of row address lines 62(a . . . z) are all brought to a high positive potential, such as +15 volts. In this manner, all of the memory cells 100 in the memory array 500 are erased.

When only a selected row of the memory array 500 is to be erased, the particular row address line, e.g., 62a, is raised to a high positive potential, such as +15 volts with the rest of the row addresses at ground potential. In this manner, only the memory cells in row 62a are erased.

The various EEPROM wordline voltages may be generated from the external power supply $V_{DD}$ using charge-pump capacitors located on the memory chip. Circuits for switching from one voltage to a second voltage are well known. However, in the case of EEPROMs, there is a need for improved circuits that will switch wordline reading and programming voltages. Switching of voltages presents a unique problem in that such circuits must be designed to prevent P/N junctions between the diffused areas and the substrate of such integrated circuits from becoming forward biased during application of switched voltages.

Furthermore, the voltage levels of internal nodes of a memory system are influenced by the capacitances of such nodes and by other intrinsic parasitic effects. As a result, the changing potentials on such nodes during transitions between application of read voltages and the much higher programming/erasing voltages may undesirably forward bias P/N junctions within the memory system.

The forward biasing of such P/N junctions may in turn lead to undesirable latch-up conditions. Accordingly, it is necessary to control such voltage transitions occurring between read and program or erase operations in a manner that prevents the undesirable forward biasing of P/N junctions within the memory system.

A conventional solution to the latch-up problem is disclosed in U.S. Pat. No. 5,774,406. As shown in FIG. 2, the latch-up problem may be alleviated by providing an NMOS transistor 1 having a large channel width-to-length (W/L) ratio between program line Vpp and the supply voltage VDD of memory system 10.

Although effective in preventing latch-up conditions, the inclusion of transistor 1 within memory system 10 may be problematic. For example, during the operations of memory system 10 in which oscillator 2 and charge pump 3 are inactive (during read operation), transistor 1 pulls line $V_{pp}$ to a maximum voltage equal to the supply voltage $V_{DD}$ less the threshold voltage $V_{th}$ of transistor 1. As a result, the voltage levels of nodes within memory array 4 and any additional associated logic circuitry that is designed to operate from the supply voltage $V_{DD}$ will in practice be limited to less than a full rail-to-rail voltage swing.

That is, the supply voltage is effectively reduced to $V_{DD}-V_{th}$. Since the threshold voltage of a typical NMOS transistor is typically 1V, this reduction in the effective supply voltage $V_{DD}$ becomes significant for low-voltage operations. For example, when the supply voltage $V_{DD}$ is 2.7V, the inclusion of transistor 1 in memory system 10 forces memory array 4 to operate within approximately a 1.7V voltage swing, thereby rendering an efficient operation of memory system 10 unpractical.

Moreover, memory system 10 suffers from another serious drawback. At the end of a programming cycle, additional circuitry (not shown) is required to discharge line $V_{PP}$ from a high program voltage to a lower read voltage (typically $V_{DD}$ or lower). This additional circuitry, in addition to consuming valuable silicon real estate, undesirably draws DC current from the supply voltage $V_{pp}$ thereby wasting power.

SUMMARY OF THE INVENTION

To address the above-identified problems, a high-voltage isolating circuit for controlling the discharge of high-voltage in a memory array Is provided comprising a line connected to individual memory cells of the memory array, the line having both a high-voltage portion and a low-voltage portion, such that the line is capable of providing a high-voltage and a low-voltage to the memory cells; and an isolation transistor having a first source/drain terminal coupled with the high-voltage portion of the line and an opposing source/drain terminal coupled with the low-voltage portion of the line. Further, the substrate of the transistor is coupled with the high-voltage portion of the line, such that the voltage potential of the line can be maintained within a certain voltage range when the low-voltage portion of the line is at a first voltage potential, and wherein the high-voltage portion of the line can be discharged when the low-voltage portion of the line is at a second voltage potential. As a result, latch-up of the circuit can be prevented.

Furthermore, a method of isolating a high-voltage element to prevent latch-up of a circuit is provided comprising the steps of sensing both a first and second voltage; maintaining the first voltage within a certain voltage range depending on the potential of the second voltage; and discharging the first voltage when the second voltage has a specific potential.

As a result, voltage transitions occurring between read and program or erase operations can be controlled in a manner that prevents the undesirable forward biasing of P/N junctions within the memory system.

DETAILED DESCRIPTION OF THE PREFERRED EMBODIMENT

Figure 1:
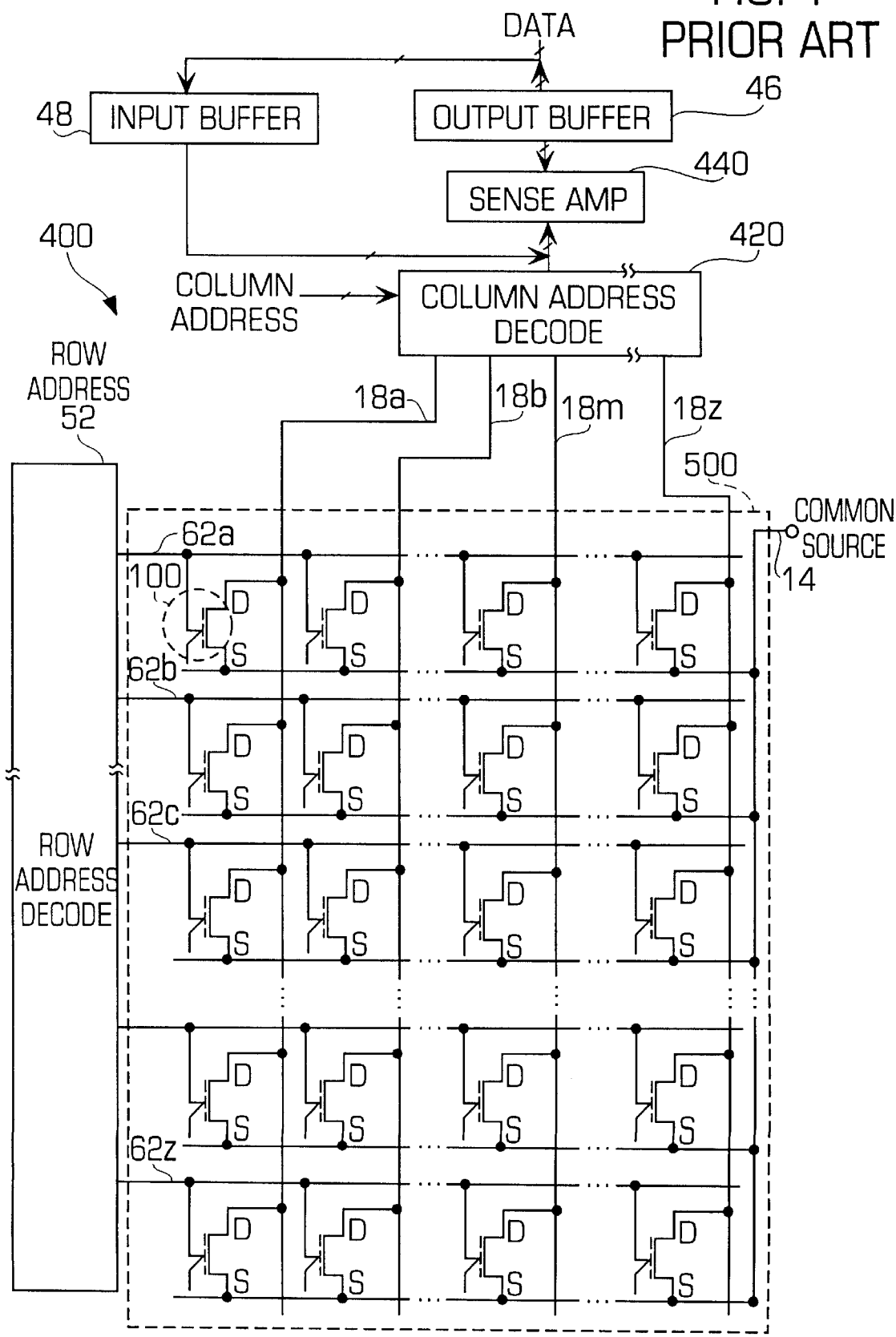
FIG. 1 is a schematic diagram of a conventional EEPROM memory array.
Figure 2:
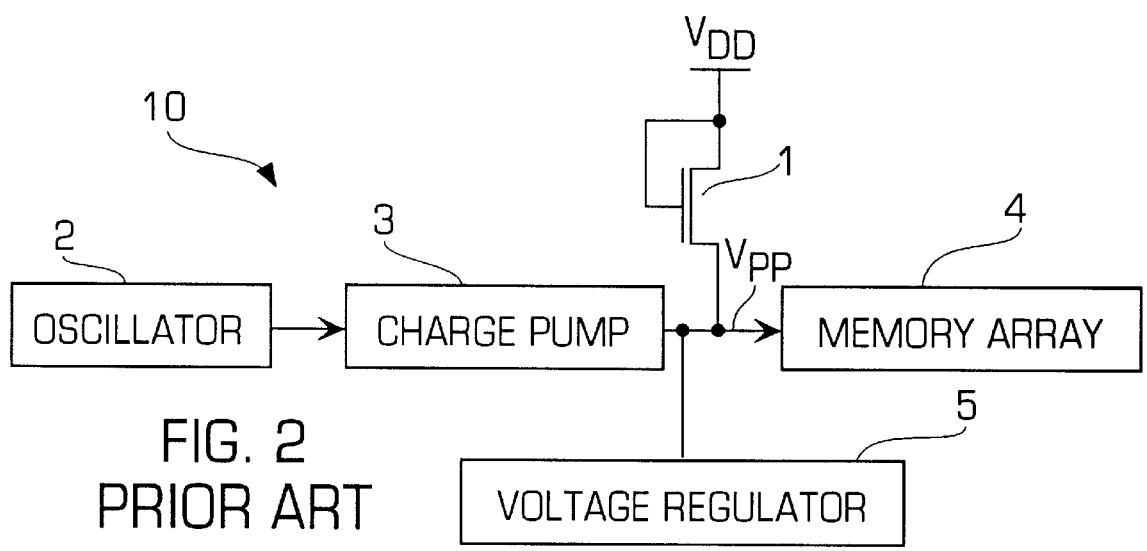
FIG. 2 is a circuit diagram of a conventional circuit used in EEPROM memory systems to alleviate the latch-up problem that can occur during high/low voltage switching operations.
Figure 3:
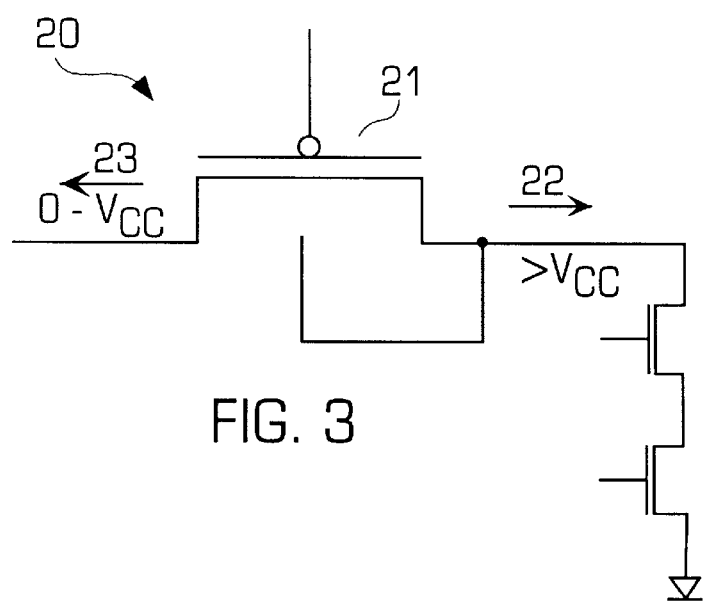
FIG. 3 is a simple circuit diagram of an isolation circuit according to an embodiment of the invention.

FIG. 3 shows a simple circuit diagram of an isolation circuit 20 according to an embodiment of the invention. As shown in FIG. 3, the isolation circuit 20 comprises a p-type (PMOS) field effect transistor (FET) 21 coupled between a high-voltage portion 22 of a wordline, and a low-voltage portion 23 of the same word line. In FIG. 3, the high-voltage portion 22 has a voltage potential greater than $V_{cc}$, while the low-voltage portion 23 has a voltage potential no greater than $V_{cc}$.

The PMOS FET 21 has its substrate connected to the high-voltage portion 22. The connection of the substrate to the high-voltage portion 22 results in the high-voltage portion 22 maintained within a certain voltage range. Furthermore, the connection of the substrate of FET 21 to the high voltage portion 22 prevents latch-up and permits the high-voltage portion 22 from falling below $V_{CC}+V_{th}$ in the event the low-voltage portion 23 is at $V_{CC}$.

Figure 4:
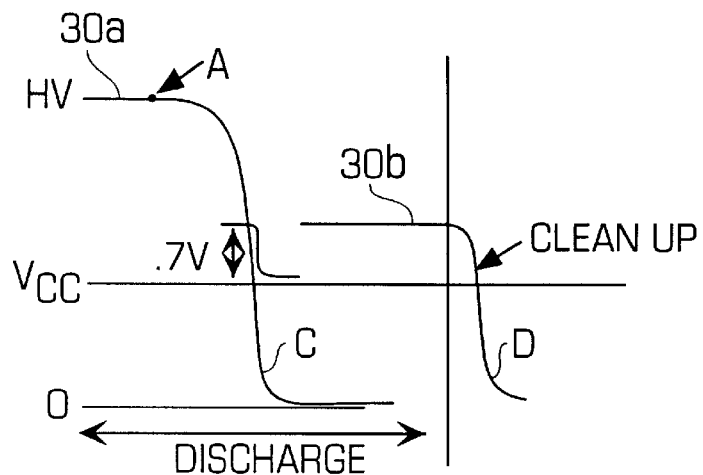
FIG. 4 is a graph of voltage-vs-current, measured across the isolation circuit of FIG. 3, showing the points at which the voltage transitions occur and the corresponding voltage range of the circuit.

Thereafter, when the low-voltage portion 23 goes to 0V, the high-voltage portion 22 can go to 0V as well. FIG. 4 is a graph of voltage-vs-current for the simple isolation circuit 20 shown in FIG. 3. The typical output voltage is shown by reference number 30a. Note that the output voltage 30a falls sharply from HIGH to LOW starting at point A. This aspect could cause latch-up to occur if the high-voltage portion 22 were to fall below $V_{cc}$, as shown by line C, as is in the prior art.

To avoid this situation, the high-voltage portion 22 is not allowed to fall below $V_{CC}+V_{th}$ (shown by reference number 30b). Such potential is maintained (for a time period indicated as "discharge") until a time when the low-voltage portion 23 of the circuit 20 goes to 0V, at which time (as shown by line D) the high-voltage portion 22 is allowed to go to 0V. Thus, latch-up can be prevented.

Figure 5:
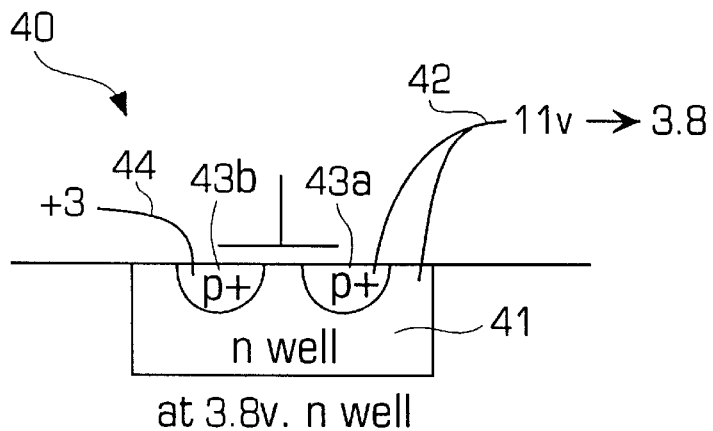
FIG. 5 is a simple cross-sectional view of a semiconductor in which the substrate is coupled to the high-voltage portion.

FIG. 5 is a simple cross-sectional view of a transistor 40 having its substrate 41 connected to a high-voltage line 42. The n-well substrate 41 of the transistor 40 and a P+ doped source/drain region 43a are connected to high-voltage line 42. The other P+ doped source/drain region 43b is connected to low-voltage line 44. The high-voltage line 42 can swing from 11V to 3.8V depending on the operation to be performed (program, erase, etc.).

Figure 6:
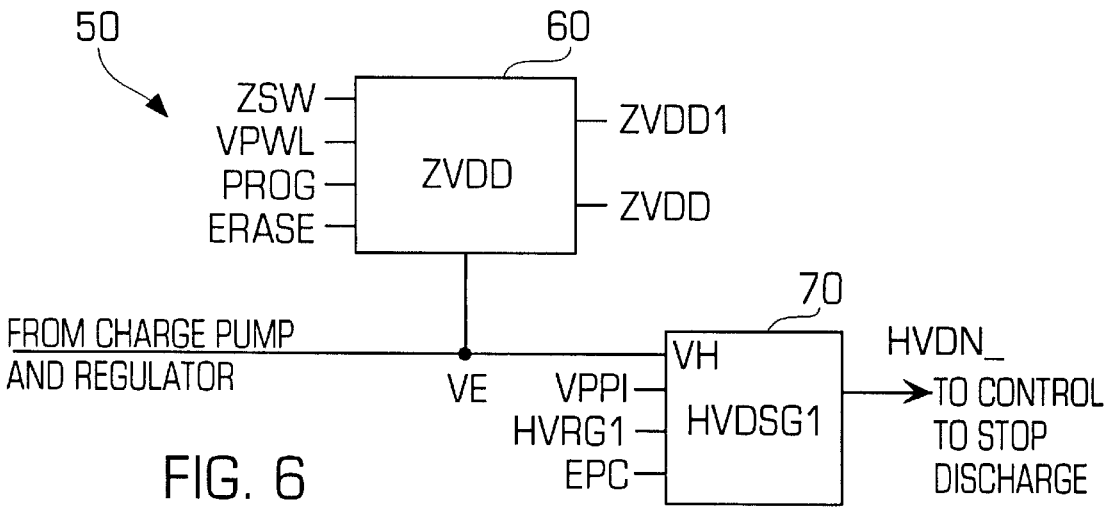
FIG. 6 is a block diagram of a portion of a memory system in which high-voltage discharge is controlled by an isolation circuit according to the present invention.

FIG. 6 shows a block diagram of a portion of a memory system 50 in which the high-voltage discharge is controlled by an isolation circuit according to the present invention.

As shown in FIG. 6, the ZVDD circuit component 60 and the HVDSG1 circuit component 70 may be connected together as follows.

The ZVDD circuit component 60 receives signals ZSW, VPWL, PROG, ERASE, and VE (which is provided from the charge pump and regulator (not shown)) and provides signals ZVDD1 and ZVDD.

The HVDSG1 circuit component 70 receives signals VPPI, HVRBI, EPC and VH (which is also provided from the charge pump and regulator (not shown)) and provides signal HVDN__. Signal HVDN__ serves as a control signal to stop the discharge of the high-voltage that will be described infra. Therefore, voltage transitions occurring between read and program or erase operations can be controlled in a manner that prevents the undesirable forward biasing of P/N junctions within the memory system 50.

Figure 7:
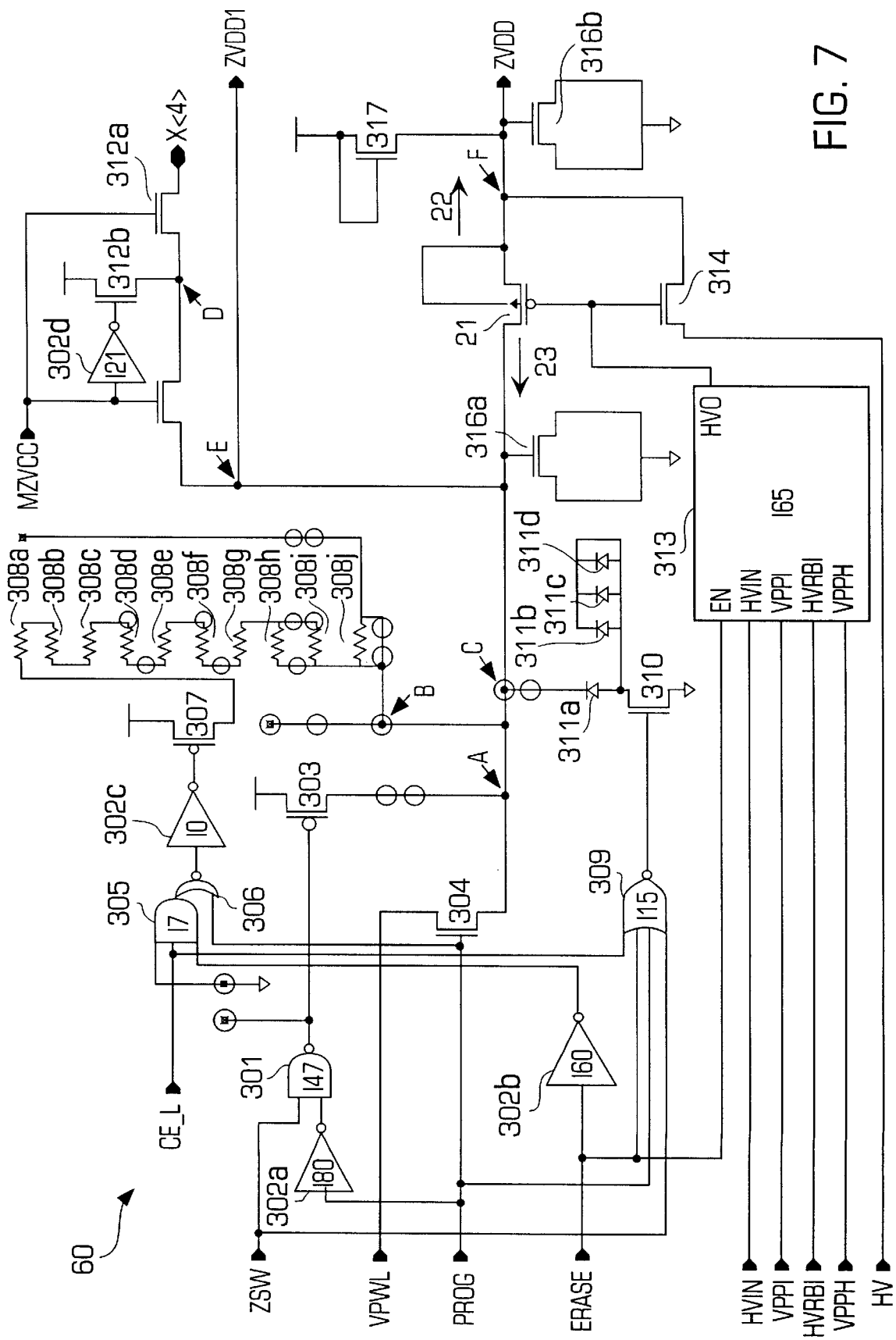
FIG. 7 is a circuit diagram of the ZVDD circuit component shown in FIG. 6.

A detailed description of the ZVDD circuit component 60 and the HVDSG1 circuit component 70 follows with reference to FIGS. 6 and 7, respectively.

As described above with reference to FIG. 6, ZVDD circuit component 60 receives signals ZSW, VPWL, PROG, ERASE and VE. Referring now to FIG. 7, specifically, signals ZSW and PROG are received by NAND gate 301 after signal PROG has been propagated through inverter 302a. ZSW signal is generated at address changes to pull ZVDD level to fall $V_{DD}$ level during word line transitions. The output of NAND gate 301 controls the switching of the p-type (PMOS) field effect transistor (FET) 303. That is, the output of NAND gate 301 is coupled to the gate terminal of PMOS FET 303. A source/drain terminal of FET 303 is connected to a voltage source $V_{cc}$ while the opposing source/drain terminal of FET 303 is coupled with a respective source/drain terminal of FET 304.

FET 304 is an n-type (NMOS) FET, its opposing source/drain terminal receiving input signal VPWL, while its gate terminal is controlled by input signal PROG. Therefore, when signal PROG is HIGH, FET 304 will be ON and signal VPWL will pass to node A.

If signal PROG is LOW, FET 304 will be OFF, and FET 303 will be ON when signal ZSW is HIGH. In that situation, $V_{cc}$ will pass to node A.

A three-input AND gate 305 is provided having a first input terminal grounded, the second input terminal receiving input signal CE_L, and the third input terminal receiving input signal ERASE after it has been propagated through inverter 302b. The output of AND gate 305 is received as one input of the two-input NOR gate 306. The other input to NOR gate 306 is input signal PROG.

PMOS FET 307 is controlled by the output of NOR gate 306. That is, the output of NOR gate 306 is connected with an inverter 302c that is further connected with the gate terminal of FET 307. FET 307 has a source/drain terminal connected to voltage source $V_{cc}$ while the opposing source/drain terminal is coupled to the first of a series of resistors 308a–j. These resistors with 311a zener diode will set the read voltage on word line which is limited voltage with $V_{cc}$ range. While resistors 308a–j are serially connected, two resistors 308h, 308i in the series are connected in parallel. The opposing terminal of resistor 308j that is not connected to resistor 308i is connected to node B.

Therefore the output of NOR gate 306 will be HIGH when signal PROG is LOW, turning FET 307 ON and thus providing a voltage $V_{DD}$ less the cumulative voltage drop through the resistors 308a–j at node B.

Additionally, a four-input NOR gate 309 receives input signals CE_L, ERASE, PROG, and ZSW. The output of NOR gate 309 controls NMOS FET 310. That is, the output of NOR gate 309 is coupled with the gate terminal of FET 310. FET 310 has a source/drain terminal grounded, while an opposing source/drain terminal is connected to diodes 311a–d. Diodes 311a–d have a breakdown voltage of 3V. Further, diodes 311b–d are connected in parallel, while diode 311a has one terminal connected to the like connection of the parallel connected diodes 311b–d and the opposing terminal of diode 311a is connected to node C.

Thus, if every signal CE_L, ERASE, PROG and ZSW is HIGH or if every signal CE_L, ERASE, PROG and ZSW is LOW, FET 310 will be ON and node C will be pulled LOW.

As described above, signals ZVDD and ZVDD1 are provided by the ZVDD circuit component 60. The output signal ZVDD1 is provided as follows.

FETs 312a–c each receive input signal MZVCC at their respective gate terminals. Although, FET 312b receives the complemented signal due to the presence of inverter 302d. Thus, signal MZVCC and its complement serve as control signals for the transistors 312a–c.

FETs 312a, 312c are serially connected. That is, a source/drain terminal of FET 312c is connected with a respective source/drain terminal of FET 312a at a common node D. The opposing, source/drain terminal of FET 312a is connected with signal X<4>. Additionally, FET 312b has a source/drain terminal connected with node D, while the opposing source/drain terminal is connected with voltage source $V_{CC}$.

Therefore, if input signal MZVCC is HIGH, FETs 312a, 312c will be ON, and will pass signal X<4> (after the threshold drops through FETs 312a, 312c) to node E from which the output signal ZVDD1 is provided. This signal ZVDD1 is provided to the X-decoder (not shown) and _xpZ drivers (not shown) to prevent the X-decoder n-well from forward biasing during conditions lower than $V_{DD}$.

If however, input signal MZVCC is LOW, FET 312b will be ON but FET 312c will be OFF. Thus, node D will have a potential of $V_{CC}$ less the threshold drop of FET 312b, but FET 312c will prevent this voltage from being passed to node E.

Output signal ZVDD is provided as follows. HVSW is activated during erase to pass high voltage $V_e$, to ZVDD and wordline. HVSW 313 receives five inputs, EN, HVIN, VPPI, HVRBI, and VPPH (note that signal EN is received as signal ERASE) and generates output signal HVO. Output signal HVO controls NMOS FET 314 and PMOS FET 21. That is, the output of HVSW 313 is connected to the respective gate terminals of FETs 314, 21. FET 314 has a source/drain terminal connected to input signal V and an opposing source/drain terminal connected with common node F. Therefore, when signal HVO is HIGH, FET 314 is ON and signal V passes to node F (assuming threshold drop across FET 314).

FET 21 is a PMOS field effect transistor. FET 21 has a source/drain terminal coupled with the gate terminal of FET 316a. FET 316a has its source and drain terminals connected together, such that FET 316a acts as a capacitor, storing a low-voltage from either of nodes A, B, C or E. The opposing source/drain terminal of FET 21 is coupled with node F. Additionally, the substrate of transistor 21 is coupled with node F (a high-voltage) such that the high-voltage can be maintained within a certain voltage range. Furthermore, the connection of the substrate of FET 21 to the high voltage node F prevents latch-up and permits the high-voltage node F from falling below $V_{CC}+V_{th}$ in the event the low-voltage side is at $V_{CC}$. Thereafter, when the low-voltage side goes to 0V, the high-voltage side can go to 0V as well.

Finally, FET 317 has a source/drain terminal connected with its gate terminal such that FET 316 is diode-connected. That source/drain terminal is further connected with voltage source $V_{DD}$. The opposing source/drain terminal is coupled to node F. Additionally, FET 316b has its source and drain terminals connected together, such that FET 316b acts as a capacitor, storing a high-voltage from node F from which output signal ZVDD is provided.

If signal ZVDD discharges lower than signal ZVDD1, then transistor 21 will become forward-diode connected and latch-up. In order to avoid this situation, signal ZVDD must be discharged up to $V_{CC}+V_{th}$ by detecting a high-voltage through PMOS FET 21 in FIG. 8 (to be described herein) and send signal HVDN_ to stop discharging.

Figure 8:
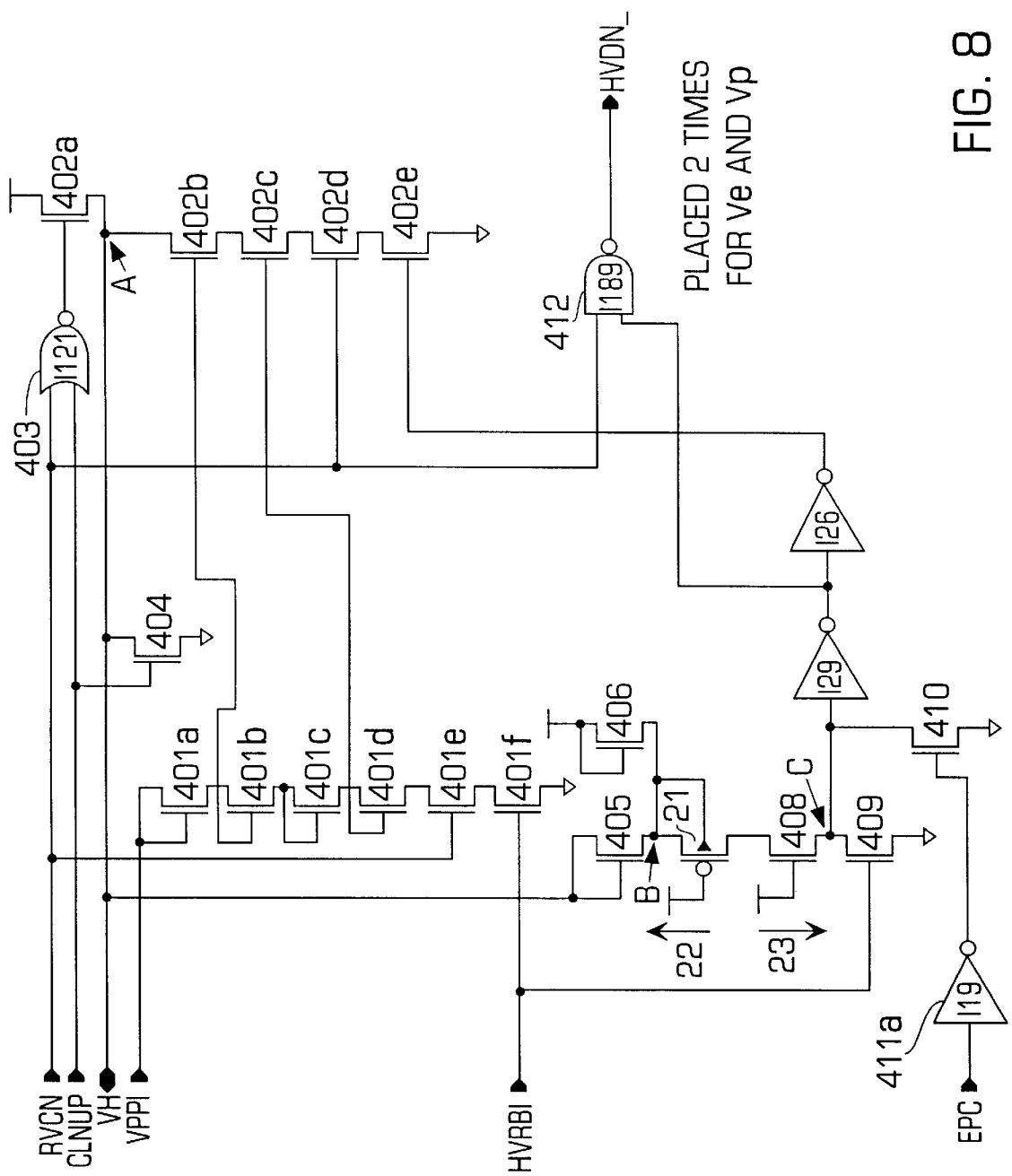
FIG. 8 is a circuit diagram of the HVDSG1 circuit component shown in FIG. 6.

Referring now to FIG. 8, FETs 401a–f are serially connected with FETs 401a–d diode connected. Further, FET 401a receives input signal VPPI. FET 401e has a source/drain terminal connected with a respective source/drain terminal of FET 401d. Additionally, the gate terminal of FET 401e receives input signal RMDN. Likewise, FET 401f has a source/drain terminal connected with a respective source/drain terminal of FET 401e. Additionally, the gate terminal of FET 401f receives input signal HVRBI. The opposing source/drain terminal of FET 401f is connected to ground.

FETs 402a–e are also serially connected, with FET 402a having a source/drain terminal connected with voltage source $V_{cc}$. The gate terminal of FET 402a is controlled by the output signal of NOR gate 403. That is the output of NOR gate 403 is connected with the gate terminal of FET 402a.

Further, the gate terminal of FET 402b is controlled by the signal provided at the respective source/drain connected of FETs 401a, 401b. Likewise, the gate terminal of FET 402c is controlled by the signal provided at the respective source/drain connection of FETs 401c, 401d.

The gate terminal of FET 402d is controlled by input signal RMDN while the gate terminal of FET 402e is controlled by the output of inverter 411c, which will be described infra.

Additionally, FET 402e has its opposing source/drain terminal connected with ground. Therefore, the various transistors 402b–e can be selectively controlled such that node A is pulled LOW.

NOR gate 403 receives input signals RMDN and CLNUP. Therefore, when either input signals RMDN and CLNUP are both LOW or when input signals RMDN and CLNUP are both HIGH, FET 402a will be ON and FET 402a will pass $V_{CC}$ to node A.

FET 404 has a source/drain terminal connected with input signal VH and an opposing source/drain terminal connected with ground. Additionally, the gate terminal of FET 404 is controlled by input signal CLNUP. Therefore, when signal CLNUP is HIGH, FET 404 pulls VH LOW helping ensure that $V_{CC}$ will pass to node A as described above. In contrast, if FET 402a is OFF, node A will have a potential equivalent to that of input signal VH.

FET 405 is diode connected receiving input signal VH. Additionally, FET 406 is also diode connected receiving $V_{CC}$. Transistors 405, 406 are coupled together at common node B. Also coupled to node B is a respective source/drain terminal of FET 21. FET 21 is a PMOS FET, its gate terminal connected with $V_{CC}$. The opposing source/drain terminal of FET 21 is coupled to serially connected transistor pair 408, 409. Additionally, the substrate of transistor 21 is coupled with node B (a high-voltage) such that the high-voltage can be maintained within a certain voltage range. Furthermore, the connection of the substrate of FET 21 to the high voltage node B prevents latch-Lip and permits the high-voltage node B from falling below $V_{CC}+V_{th}$ in the event the low-voltage side is at $V_{CC}$. Thereafter, when the low-voltage side goes to 0V, the high-voltage side can go to 0V as well.

While FETs 408, 409 are serially connected at node C, FET 408 has its gate terminal connected with $V_{CC}$ whereas FET 409 has its gate terminal connected with input signal HVRBI. The opposing source/drain terminal of FET 409 is connected to ground.

Signal HVDN_ is provided as follows. Input signal EPC is propagated through inverter 411a to control the gate terminal of FET 410. FET 410 has a source/drain terminal coupled at node C while the opposing source/drain terminal is connected to ground. Therefore, the potential at node C can be pulled LOW when input signal EPC is LOW.

Inverter 411b is additionally coupled with node C. The output of inverter 411b is received as an input to a two-input NAND gate 412. The other input to NAND gate 412 is input signal RMDN. Therefore, output signal HVDN_ will be HIGH provided both signal RMDN and the output of inverter 411b are not each HIGH.

Thus, as described above, in order to avoid the latch-up problem, signal ZVDD will be discharged up to $V_{CC}+V_{th}$ by detecting a high-voltage through FET 21 and thus provide signal HVDN_ to stop discharging signal ZVDD.

In conclusion, a PMOS FET 21 is coupled between a high-voltage portion 22 and a low-voltage portion 23. Generally, the high-voltage portion 22 has a voltage potential greater than $V_{CC}$, while the low-voltage portion 23 has a voltage potential no greater than $V_{CC}$.

The PMOS FET 21 has its substrate connected to the high-voltage portion 22. The connection of the substrate to the high-voltage portion 22 results in the high-voltage portion 22 maintained within a certain voltage range. Furthermore, the connection of the substrate of FET 21 to the high voltage portion 22 prevents latch-Lip and permits the high-voltage portion 22 from falling below $V_{CC}+V_{th}$ in the event the low-voltage portion 23 is at $V_{CC}$. Thereafter, when the low-voltage portion 23 goes to 0V, the high-voltage portion 22 can go to 0V as well.

What is claimed is:

1. A high-voltage isolating circuit for controlling the discharge of high-voltage in a memory array, comprising:

a line connected to individual memory cells of said memory array, said line having both a high-voltage portion and a low-voltage portion, such that said line is capable of providing a high-voltage and a low-voltage to said memory cells; and an isolation transistor having a first source/drain terminal coupled with said high-voltage portion of said line and an opposing source/drain terminal coupled with said low-voltage portion of said line, wherein the substrate of said transistor is coupled with said high-voltage portion of said line, such that the voltage potential of said line can be maintained within a certain voltage range when said low-voltage portion of said line is at a first voltage potential, and wherein said high-voltage portion of said line can be discharged when said low-voltage portion of said line is at a second voltage potential, thereby preventing latch-up of said transistor.

2. The high-voltage isolating circuit of claim 1, wherein said isolation transistor is a PMOS transistor.

3. The high-voltage isolating circuit of claim 1, wherein said certain voltage range has a lower limit one threshold reference voltage greater than said first voltage potential.

4. The high-voltage isolating circuit of claim 3, wherein said first voltage potential is VCC and said lower limit is Vcc+Vth.

5. The high-voltage isolating circuit of claim 1, wherein said second voltage potential is 0V.

6. The high-voltage isolating circuit of claim 1, wherein said line is a row line.

7. The high-voltage isolating circuit of claim 6, wherein said row line is connected to a non-volatile memory cell comprising:

a substrate having a drain region a source region, and a channel region therebetween;

a first insulating layer disposed over said drain region, said source region and said channel region;

a floating gate disposed over said first insulating layer such that said floating gate is positioned over a portion of said channel region and over a portion of said source region;

a second insulating layer having a first portion disposed over said floating gate forming a top wall, and a second portion disposed adjacent said floating gate forming a sidewall; and a control gate having a first portion and a second portion, said first portion of said control gate disposed over said top wall, said second portion of said control gate disposed over said first insulating layer and immediately adjacent said sidewall, wherein said second portion of said control gate extends over a portion of said drain region and a portion of said channel region.

8. The high-voltage isolating circuit of claim 7, wherein said substrate is a P-type silicon substrate.

9. The high-voltage isolating circuit of claim 7, wherein the insulating material of said first isolating layer is taken from the group consisting of silicon dioxide, silicon nitride, and silicon oxynitride.

10. The high-voltage isolating circuit of claim 7, wherein said floating gate is a polysilicon gate.

11. The high-voltage isolating circuit of claim 7, wherein said first portion and said second portion of said second insulating layer have different thicknesses.

12. The high-voltage isolating circuit of claim 11, wherein the insulating material of said second isolating layer is taken from the group consisting of silicon dioxide, silicon nitride, and silicon oxynitride.

13. A method of isolating a high-voltage element to prevent latch-up of a circuit comprising the steps of:

(a) sensing a first voltage and a second voltage;

(b) maintaining said first voltage within a certain voltage range if said second voltage is at a first potential voltage; and (c) discharging said first reference voltage when said second reference voltage is at a second potential voltage.

14. The method of claim 13, wherein said certain voltage range has a lower limit one threshold reference voltage greater than said first potential voltage.

15. The method of claim 14, wherein said first potential voltage is VCC and said lower limit is Vcc+Vth.

16. The method of claim 13, wherein said second potential voltage is 0V.

\* \* \* \* \*